United States Patent [19]

Otsuki

[11] Patent Number: 4,918,400
[45] Date of Patent: Apr. 17, 1990

[54] AMPLIFIER CIRCUIT
[75] Inventor: Takashi Otsuki, Ota, Japan
[73] Assignee: Sanyo Electric Co., Ltd., Osaka, Japan
[21] Appl. No.: 339,729
[22] Filed: Apr. 18, 1989
[30] Foreign Application Priority Data Apr. 20, 1988 [JP] Japan ................... 63-97322

[51] Int. Cl.$^4$ ............................................. H03F 3/30
[52] U.S. Cl. .................................. 330/273; 330/270; 330/271; 330/296
[58] Field of Search ............... 330/123, 265, 267, 268, 330/270, 271, 273, 274, 296

[56] References Cited
U.S. PATENT DOCUMENTS 3,857,105 12/1974 Avery ................... 330/296

FOREIGN PATENT DOCUMENTS 133110 10/1980 Japan ................... 330/296

Primary Examiner—James B. Mullins
Attorney, Agent, or Firm—Darby & Darby

[57] ABSTRACT

An amplifier circuit comprising an input amplifier stage, a push-pull output stage, a bias stage having the same construction as the input amplifier stage, a first resistor to be given a current flowing through the bias stage, second and third resistors connected along with the first resistor between a power supply and the ground in series therewith, and fourth and fifth resistors connected between the output point of the push-pull output stage and the ground in series therewith. The point of connection between the fourth resistor and the fifth resistor is connected to the input amplifier stage to provide a negative feedback loop having no capacitor.

6 Claims, 2 Drawing Sheets

AMPLIFIER CIRCUIT

FIELD OF THE INVENTION

The present invention relates to amplifier circuits for use in audio power amplifiers or the like for feeding audio signals to a speaker, and more particularly to such amplifier circuits which need not be equipped with an feedback capacitor.

BACKGROUND OF THE INVENTION

FIG. 4 shows a known amplifier circuit comprising a differential input amplifier stage 4 and a push-pull output stage 8. With this amplifier circuit, an input signal from an input signal source 1 is amplified by the input amplifier stage 4 which comprises first and second transistors 2, 3 having their emitters connected to each other. The resulting output signal is applied from the collector of the second transistor 3 to a drive stage 5, which in turn produces two signals out of phase with each other by 180 degrees. These signals are applied to third and fourth transistors 6, 7 constituting the push-pull output stage 8. A pushpull signal obtained at the output point A of the stage 8 is fed to a speaker 10 via an output coupling capacitor 9 to drive the speaker 10.

With the above circuit, the signal from the input signal source 1 is fed to the base of the first transistor 2 via an input coupling capacitor 11. The base has connected thereto a bias circuit 16 comprising first to third resistors 12, 13, 14 and a decoupling capacitor 15. Connected between the output point A of the output stage 8 and the ground is a negative feedback circuit 20 comprising fourth and fifth resistors 17, 18 and a negative feedback capacitor 19. The point of connection, B, between the fourth resistor 17 and the fifth resistor 18 is connected to the base of the second transistor 3.

Accordingly, the a.c. input signal from the input signal source 1 and d.c. bias voltage from the bias circuit 16 are applied to the base of the first transistor 2, while the a.c. signal from the output point A, as voltage-divided by the fourth and fifth resistors 17, 18, is applied to the base of the second transistor 3, with d.c. voltage at the output point A also applied as it is to the same base.

When the first resistor 12 and the second resistor 13 are made equal in resistance value, one-half of the power supply voltage Vcc is available at the point C shown. Further if the third resistor 14 is made equal to the fourth resistor 17 in resistance value, the d.c. voltage at the output point A also becomes equal to one-half the power supply voltage Vcc through the negative feedback action. Consequently it is possible to maximize the range in which the output signal at the output point A is free of distortion, i.e. the dynamic range of the output signal.

However, if it is attempted to fabricate the circuit of FIG. 4 in the form of an integrated circuit, the input coupling capacitor 11, output coupling capacitor 9, decoupling capacitor 15, negative feedback capacitor 19, etc. must be arranged externally of the integrated circuit. This gives rise to the problem of increasing the number of external parts. Furthermore, the connection of these external parts to the integrated circuit entails the problem that many external pins need to be connected to the circuit.

Further if one end of the fifth resistor 18 is merely grounded to eliminate the feedback capacitor 19 and thereby reduce the number of external parts and external pins, it becomes no longer possible to effect the negative feedback operation normally and to maintain the voltage at the output point A at Vcc/2 because the impedance of the base of the second transistor 3 lowers. Alternatively if it is attempted to give an increased value to the fifth resistor 18 with the negative feedback capacitor 19 removed so as to maintain the output point voltage at Vcc/2, the amount of a.c. feedback increases to greatly decrease the voltage gain of the amplifier circuit, while it is then difficult to incorporate the fifth resistor 18 into the integrated circuit.

SUMMARY OF THE INVENTION

The main object of the present invention is to provide an amplifier circuit without the negative feedback capacitor which has heretofore been indispensable so that the amplifier circuit can be fabricated as an integrated circuit with a reduced number of external parts.

The amplifier circuit of the present invention comprises an amplifier stage for an input a.c. signal, a push-pull output stage for driving a speaker or like load in accordance with the output signal of the amplifier stage, a bias stage having the same construction as the input amplifier stage for setting a bias for the amplifier stage, a first resistor connected between the bias stage and the ground and to be given a current passing through the bias stage, a second resistor and a third resistor connected in series with each other and connected between a power supply and the first resistor, and a fourth resistor and a fifth resistor connected between the output point of the push-pull output stage and the ground in series therewith, the point of connection between the fourth resistor and the fifth resistor being connected to the input amplifier stage to provide a feedback loop.

With the above amplifier circuit, the input amplifier stage and the bias stage are identical in construction, so that when the first to fifth resistors are set to appropriate resistance values as will be described later, the value of current supplied from the bias stage to the first resistor becomes equal to the value of current supplied from the input amplifier stage to the fifth resistor, with the first resistor made equal to the fifth resistor in terminal voltage.

Consequently, the value of current flowing from the third resistor into the first resistor becomes equal to the value of current flowing from the output point of the push-pull output stage into the fifth resistor via the fourth resistor, and the d.c. voltage (½ of the power supply voltage Vcc) at the point of connection between the second resistor and the third resistor is maintained at the same value as the d.c. voltage at the output point of the push-pull stage to give a maximum dynamic range.

The voltage gain of the amplifier circuit can be determined according to the resistance ratio between the fourth resistor and the fifth resistor.

According to the present invention, the circuit corresponding to the conventional negative feedback circuit consists only of the fourth resistor and the fifth resistor without the feedback capacitor conventionally used. In fabricating the amplifier circuit in the form of an integrated circuit, this assures great advantages such as a reduction in the number of external parts.

DETAILED DESCRIPTION OF EMBODIMENTS

Figure 1:
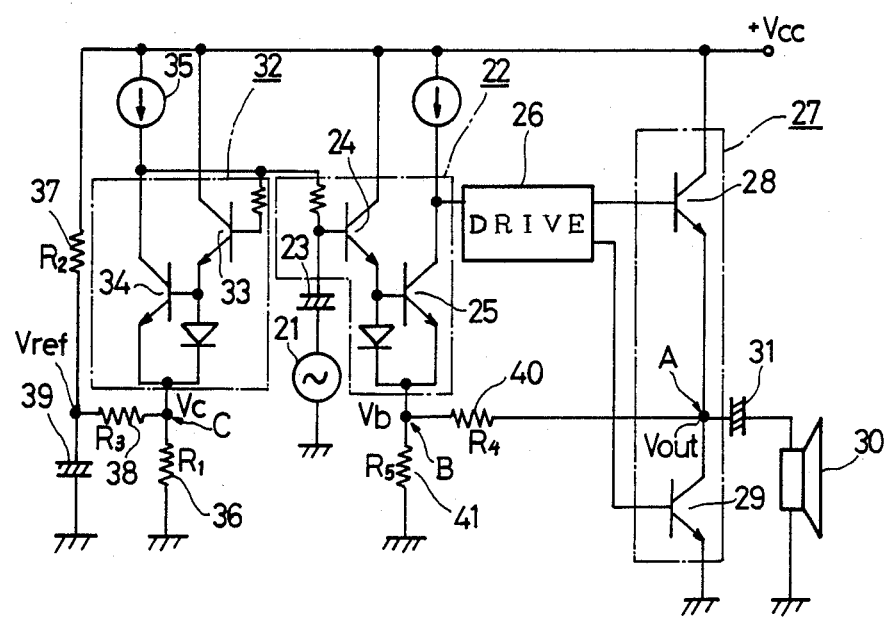
FIG. 1 is a diagram showing an amplifier circuit embodying the invention.

FIG. 1 shows a specific example of amplifier circuit embodying the invention.

In this circuit, an a.c. input signal is fed from an input signal source 21 to an input amplifier stage 22 and is thereby amplified. The input terminal of the input signal source 21 is connected via an input coupling capacitor 23 to the base of an input transistor 24, and the emitter of the input transistor 24 is connected to the base of an output transistor 25 to provide the input amplifier stage 22.

The collector of the output transistor 25 is connected to the drive stage 26 to be described later to further amplify the output signal of the input amplifier stage 22.

The drive stage 26 has a pair of output terminals connected to a push-pull output stage 27 which comprises first and second transistors 28, 29 push-pull connected to each other. The output stage has an output point A connected via an output coupling capacitor 31 to a speaker 30 serving as a load.

The output terminal of the input coupling capacitor 23 has connected thereto a bias stage 32 having the same construction as the input amplifier stage 22 and comprising an input transistor 33 and an output transistor 34 for amplifying the output signal from the input transistor 33.

A common bias current is supplied from a constant-current source 35 to the input amplifier stage 22 and the bias stage 32.

A first resistor 36 serving as first resistor means is connected between the ground and the emitter of the output transistor 34 of the bias stage 32. A second resistor 37 and a third resistor 38 connected in series with each other and serving as second resistor means are connected between a power supply (+Vcc) and the first resistor 36 in series with the first resistor 36. The point of connection between the second resistor 37 and the third resistor 38 is grounded via a decoupling capacitor 39.

Feedback fourth and fifth resistors 40 and 41 serving as third resistor means are connected between the output point A of the push-pull output stage 27 and the ground in series therewith. The point of connection, B, between these two resistors is connected to the emitter of the output transistor 25 of the input amplifier stage 22 to provide a negative feedback loop.

Figure 3:
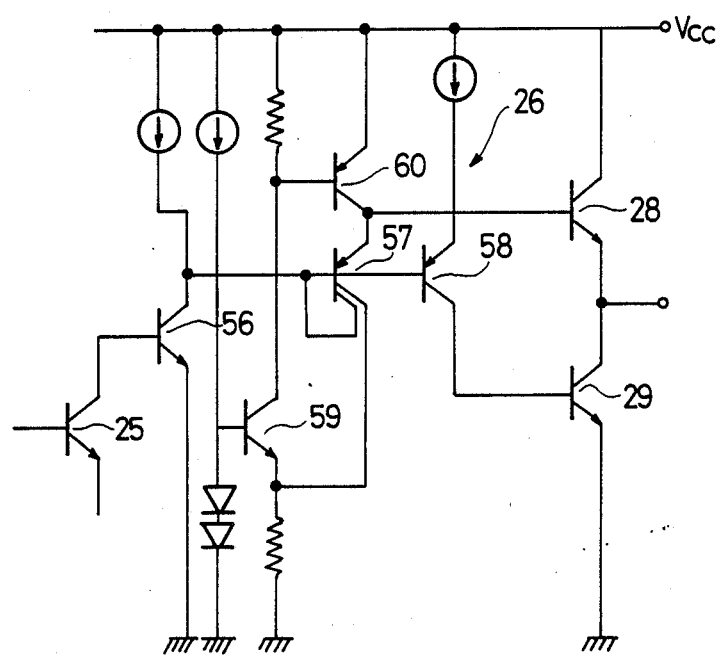
FIG. 3 is a circuit diagram of a drive stage.
Figure 4:
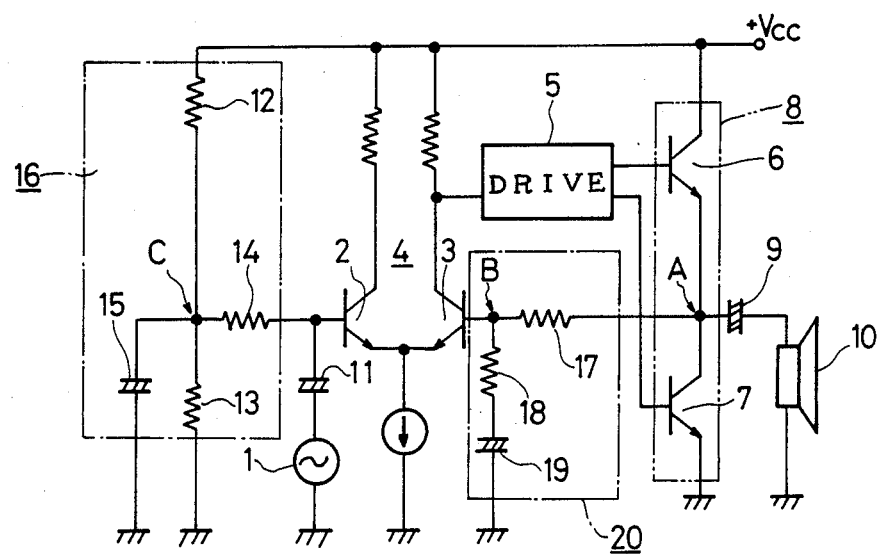
FIG. 4 is a diagram showing a conventional amplifier circuit.

The drive stage 26 comprises a known circuit. FIG. 3 shows an example of such circuit.

The drive stage 26 of FIG. 3 comprises a predriver transistor 56 adapted for class-A operation to produce a positive or negative output at its collector, and first to fourth driver transistors 57, 58, 59, 60 which are brought into or out of conduction depending on whether the output of the predriver transistor 56 is positive or negative. When the output of the predriver transistor 56 is positive, the stage 26 turns on the first transistor 28 of the output stage 27. When the output of the predriver transistor 56 is negative, the second transistor 29 of the output stage is turned on.

Next, the operation of the amplifier circuit shown in FIG. 1 will be described.

When the power supply +Vcc is turned on, the output current of the constant-current source 35 is supplied to the bias stage 32, causing the output transistor 34 of the bias stage to produce a first current $I_1$ at its emitter, i.e.. at point C. Simulataneously with this, current flows through the series circuit composed of the second, third and first resistors 37, 38, 36 to charge the decoupling capacitor 39.

When the decoupling capacitor 39 has been completely charged up, the voltage Vc at the point C is expressed by the following equation.

$$Vc = R_1(I_1 + I_2) \quad (1)$$

where $I_2$ is the current flowing from the third resistor 38 into the first resistor 36, and $R_1$ is the resistance value of the first resistor 36.

The terminal voltage Vref of the decoupling capacitor 39 is express d by the following equation.

$$\begin{aligned} Vref &= R_3 I_3 + Vc \\ &= R_1 I_1 + (R_1 + R_3)I_2 \end{aligned} \quad (2)$$

where $R_3$ is the resistance value of the third resistor 38.

Suppose the value of current produced at the emitter of the output transistor 25 of the input amplifier stage 22 is $I_3$, the value of current flowing from the feedback fourth resistor 40 into the fifth resistor 41 is $I_4$, and the resistance value of the fifth resistor 41 is $R_5$. The voltage Vb at point B is then expressed by:

$$Vb = R_5(I_3 + I_4) \quad (3)$$

Accordingly, the voltage Vout at the output point A is given by:

$$\begin{aligned} Vout &= R_4 I_4 + Vb \\ &= R_5 I_3 + (R_4 + R_5)I_4 \end{aligned} \quad (4)$$

where $R_4$ is the resistance value of the fourth resistor 40.

It is noted that the input amplifier stage 22 and the bias stage 32 are identical in construction. Accordingly, when the resistance values $R_2$, $R_3$, $R_4$ of the second resistor 37. The third resistor 38 and the fourth resistor 40 are made equal to one another, with the resistance value $R_1$ of the first resistor 36 made equal to the resistance value $R_5$ of the fifth resistor 41, the current value $I_3$ obtained from the input amplifier stage 22 becomes equal to the current value $I_1$ obtained from the bias stage 32, and the voltage Vb at the point B becomes equal to the voltage Vc at the point C.

Accordingly, as will be apparent from the equations (1) and (3), the current $I_2$ flowing from the third resistor 38 into the first resistor 36 becomes equal to the current $I_4$ flowing from the fourth resistor 40 into the fifth resistor 41. The equations (2) and (4) indicate that the terminal voltage Vref of the decoupling capacitor 39 becomes equal to the voltage Vout at the output point A.

Further if the resistance value $R_1$ of the first resistor 36 is made much smaller than the resistance value $R_2$ of the second resistor 37, it follows from the equation (2) that the voltage Vref becomes approximately equal to $R_3 I_2$. The current $I_2$ then has the following relationship with the power supply voltage Vcc.

$$I_2 \approx \frac{Vcc}{R_2 + R_3}$$

Accordingly, $$Vref \approx \frac{R_3}{R_2 + R_3} \cdot Vcc = \tfrac{1}{2} Vcc \tag{5}$$

Thus, the reference voltage Vref becomes equal to Vcc/2, and accordingly, the output voltage Vout also becomes equal to Vcc/2.

With the circuit of FIG. 1, therefore, the d.c. voltage at the output point A of the push-pull output stage can be maintained at one-half of the power supply voltage +Vcc at all times.

Further with the circuit of FIG. 1, the a.c. voltage gain is $(1+R_4/R_5)$. This indicates that a desired a.c. voltage gain can be obtained without using any feedback capacitor by adjusting the values $R_4$ and $R_5$ of the first and fifth resistors 40, 41 while fulfilling the foregoing requirement as to the resistance values.

Figure 2:
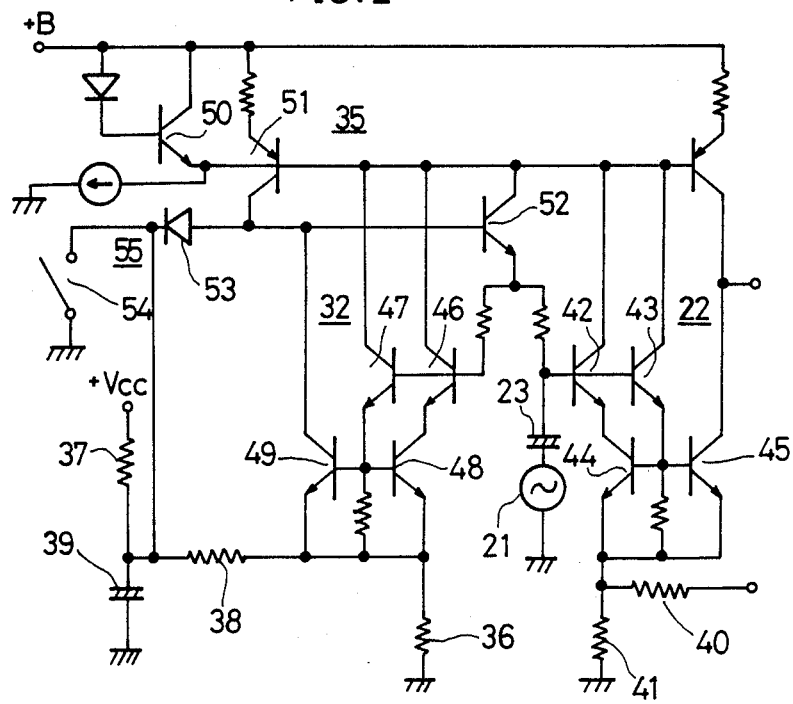
FIG. 2 is a diagram showing another amplifier circuit embodying the invention.

FIG. 2 shows another embodiment of the invention. The circuit is characterized in that it includes an input amplifier stage 22 comprising first to fourth transistors 42, 43, 44, 45, a bias stage 32 comprising fifth to eighth transistors 46, 47, 48, 49, a constant-current supply 35 comprising ninth to eleventh transistors 50, 51, 52, a muting circuit 55 connected between the base of the eleventh transistor 52 and the ground and comprising a diode 53 and a switch 54, and a decoupling capacitor 39 connected at its one terminal to one terminal of the switch 54.

When an external mute signal is given, the muting circuit 55 mutes the input amplifier state 22 to preclude generation of interfering signals. When the switch 54 is closed, the eleventh transistor 52 is brought out of conduction to discontinue the supply of current to the input amplifier stage 22 and the bias stage 32.

The other components of the circuit are the same as the corresponding ones shown in FIG. 1, so that like parts are designated by like reference numerals and will not be described.

With the input amplifier stage 22 of the amplifier circuit of FIG. 2, the input current through the collector of the third transistor 44 is always accurately in match with the output current through the collector of the fourth transistor 45 despite the current amplification factor β of the transistors. Thus, the input matches the output satisfactorily, making it possible to compensate for variations in the current amplification factor β of the transistors. The bias stage 32 is identical with the input amplification stage 22 and therefore has the same advantage.

As described above, the present invention provides amplifier circuits which need not include any negative feedback capacitor. Accordingly, the circuit can be fabricated in the form of an integrated circuit with a reduced number of external parts and pins. This assures a great advantage especially when circuits including a radio frequency amplifier stage through a power amplifier are incorporated into a single integrated circuit.

Furthermore, the d.c. voltage at the output point can be maintained at Vcc/2, whereby a maximized dynamic range can be obtained. The amplifier circuit is settable to a desired a.c. gain.

Further according to the invention, there is no need to use any negative feedback capacitor. This precludes the shock noise which would be produced due to the negative feedback capacitor when the power supply is turned on, consequently eliminating the need to provide a special shock noise preventing circuit.

The construction of the circuit of the invention is not limited to those of the foregoing embodiments but can of course be modified variously by one skilled in the art without departing from the scope of the invention as defined in the appended claims.

For example, the decoupling capacitor 39 shown in FIG. 1 can be dispensed with. In this case, a single resistor corresponding to the combination of second and third resistors 37, 38 is connected between the power supply and the first resistor 36.

What is claimed is:

1. An amplifier circuit comprising an input amplifier stage for amplifying an input a.c. signal, a push-pull output stage for driving a load in accordance with the output signal of the amplifier stage, a bias stage having the same construction as the input amplifier stage for setting a bias for the amplifier stage, first resistor means connected between the bias stage and a ground and to be given a current passing through the bias stage, second resistor means connected between a power supply and the first resistor means in series with the first resistor means, and third resistor means connected between the output point of the push-pull output stage and the ground, the third resistor means comprising two resistors connected in series with each other, whereby a signal obtained at the point of connection between the two resistors is negatively fed back to the input amplifier stage to set a gain for the input amplifier stage.

2. Amplifier circuit as defined in claim 1 wherein the input amplifier stage comprises an emitter-follower connected input transistor and an output transistor having a grounded emitter connection, and the emitter of the output transistor is connected to the point of connection between the two resistors constituting the third resistor means.

3. An amplifier circuit as defined in claim 1 wherein the bias stage comprises an emitter-follower connected input transistor and an output transistor having a grounded emitter connection, and the emitter of the output transistor is connected to the point of connection between the first resistor means and the second resistor means.

4. An amplifier circuit as defined in claim 1 wherein the second resistor means comprises two resistors connected in series with each other and connected between the power supply and the first resistor means.

5. An amplifier circuit as defined in claim 4 wherein the resistance value of the first resistor means is equal to the resistance value of the ground side resistor of the third resistor means, and the resistance value of resistor of the second resistor means closer to the first resistor means is equal to the resistance value of the resistor or the third resistor means closer to the push-pull output stage.

6. An amplifier circuit as defined in claim 4 wherein a decoupling capacitor is connected to the point of connection between the two resistors constituting the second resistor means, and the two resistors of the second resistor means are equal to each other in resistance value, the output voltage of the push-pull output stage being set to the same value as the terminal voltage Vcc/2, wherein Vcc is the power supply voltage, of the decoupling capacitor.

* * * * *